(12) United States Patent
Chang

(10) Patent No.: US 7,381,266 B1
(45) Date of Patent: Jun. 3, 2008

(54) SAPPHIRE CRYSTAL GROWTH METHOD

(76) Inventor: Yu-Feng Chang, 8, Lane 111, Wenchang St., Bade, Taoyuan County (TW)

( * ) Notice: Subject to any disclaimer, the term of this patent is extended or adjusted under 35 U.S.C. 154(b) by 0 days.

(21) Appl. No.: 11/645,934

(22) Filed: Dec. 27, 2006

(51) Int. Cl.
*C30B 25/12* (2006.01)

(52) U.S. Cl. .............................. 117/81; 117/13; 117/83; 427/162

(58) Field of Classification Search .................. 117/13, 117/81, 83; 427/162
See application file for complete search history.

(56) References Cited

U.S. PATENT DOCUMENTS 3,610,741 A * 10/1971 Davies et al. ................ 427/162
7,067,007 B2 * 6/2006 Ackermann et al. .......... 117/13

* cited by examiner

*Primary Examiner*—Felisa C Hiteshew
(74) *Attorney, Agent, or Firm*—Alan Kamrath; Kamrath & Associates PA

(57) ABSTRACT

A sapphire crystal growth method includes a first step of grinding, a second step of purification, a third step of spraying and drying particles, a fourth step of adding organic bonding agent, a fifth step of press molding, and a sixth step of crystal growth. Thus, the sapphire crystal growth method has a shorter crystal growth time than that of the conventional crystal growth method. In addition, the sapphire crystal growth method has a lower price, has crystals whose mass and size are unlimited, and has a higher quality.

14 Claims, No Drawings

SAPPHIRE CRYSTAL GROWTH METHOD

BACKGROUND OF THE INVENTION

1. Field of the Invention

The present invention relates to a crystal growth method and, more particularly, to a sapphire crystal growth method.

2. Description of the Related Art

A conventional sapphire crystal growth method comprises a flame fusion process, wherein the aluminum oxide powder is falling down and melted by a torch which is formed by burning hydrogen and oxygen. The liquid aluminum oxide is dripped onto a pan and then solidified to form a single-crystal aluminum oxide having a diameter reaching about 3 centimeters. However, such a single-crystal aluminum oxide contains air bubbles and an aluminum oxide powder that has not been melted, and has a residual stress, thereby decreasing the quality of the sapphire crystal.

Another conventional sapphire crystal growth method comprises a flux growth process, wherein the aluminum oxide is melted at a temperature under 2050° C. by aid of an assistant, such as the plumbum (Pb) oxide, aluminum fluoride and sodium fluoride. Then, the liquid aluminum oxide is cooled and saturated. However, the flux growth process is not available for mass production in the industry.

Another conventional sapphire crystal growth method comprises a Czochralski process, wherein the aluminum oxide powder is placed in a crucible, and the crucible is heater by a graphite resistance so that the aluminum oxide powder is melted in the inert gas or in the vacuum. Then, the sapphire crystal falls down gradually to touch the liquid surface slightly. At this time, the sapphire crystal is rotated slowly and drawn upwardly to draw out the sapphire crystal.

Another conventional sapphire crystal growth method comprises a thermal gradient technique which is researched by the Crystal System company in 1978. The thermal gradient technique includes a crucible in a vacuum resistance furnace, a thermal body and a shielding device. However, the thermal gradient technique produces a molybdenum (Mo) pollution during the crystal growth.

Another conventional sapphire crystal growth method comprises an edge-defined film-fed growth (EFG) process, wherein the sapphire crystal is not rotated during the crystal growth, and the diameter and shape of the sapphire crystal is controlled by a die floating at the liquid surface of the aluminum oxide. However, the sapphire crystal contains a residual stress with a high density and incurs a dislocation, so that the edge-defined film-fed growth (EFG) process is not available for the semi-conductor substrate.

Another conventional sapphire crystal growth method comprises a Kyropoulos process, wherein the sapphire crystal is not rotated during the crystal growth and is not drawn upwardly. On the contrary, the sapphire crystal is solidified, cooled and shrunk in the crucible. However, the size of the sapphire crystal is slightly smaller than that of in the crucible, so that the sapphire crystal needs a complicated working procedure to reach the final diameter.

Thus, the sapphire crystal grown by the above-mentioned growth methods has limited mass and size, has a lower quality, has a higher price and has a longer growing time.

BRIEF SUMMARY OF THE INVENTION

In accordance with the present invention, there is provided a sapphire crystal growth method, comprising a first step of grinding including crushing and grinding a powder of an aluminum oxide into micro powder particles, a second step of purification including purifying the powder particles of the aluminum oxide to reach a purity more than 99.999%, a third step of spraying and drying particles including stirring the purified powder particles of the aluminum oxide to form a glue-shaped aluminum oxide, pressurizing the glue-shaped aluminum oxide, spraying the glue-shaped aluminum oxide, and drying the glue-shaped aluminum oxide to form aluminum oxide particles having uniform sizes, a fourth step of adding organic bonding agent including adding an organic bonding agent into the aluminum oxide particles having uniform sizes, a fifth step of press molding including press molding the aluminum oxide particles having uniform sizes to form an aluminum oxide blank having a predetermined shape, and a sixth step of crystal growth including pre-burning the aluminum oxide blank having a predetermined shape into an aluminum oxide cake disposed at a half-baked state, heating the aluminum oxide cake into a melted state until aluminum oxide crystals are grown, and solidifying, cooling and shrinking the aluminum oxide crystals into a single-crystal sapphire.

The primary objective of the present invention is to provide a sapphire crystal growth method, wherein the temperature gradient is directed toward a direction opposite to that of the gravity during the crystal growth, while the crucible, the crystal and the thermal body are stationary so as to prevent from incurring a melt flow due to the heat convection and mechanical movement.

Another objective of the present invention is to provide a sapphire crystal growth method, wherein the crystal is encompassed by the melt and disposed in the thermal zone after the crystal growth, so that the cooling speed of the crystal can be controlled to reduce the thermal stress, thereby preventing the crystal from being broken and dislocated.

A further objective of the present invention is to provide a sapphire crystal growth method, wherein the solid-liquid interface is encompassed by the melt during the crystal growth, so that the temperature and mechanical perturbations on the surface of the crystal are reduced or eliminated by the melt, thereby enhancing the quality of the crystal.

A further objective of the present invention is to provide a sapphire crystal growth method that has a shorter crystal growth time than that of the conventional crystal growth method.

A further objective of the present invention is to provide a sapphire crystal growth method that has a lower price.

A further objective of the present invention is to provide a sapphire crystal growth method that has crystals whose mass and size are unlimited, and has a higher quality.

Further benefits and advantages of the present invention will become apparent after a careful reading of the detailed description with appropriate reference to the accompanying drawings.

BRIEF DESCRIPTION OF THE SEVERAL VIEWS OF THE DRAWING(S)

Not applicable

DETAILED DESCRIPTION OF THE INVENTION

A sapphire crystal growth method in accordance with the preferred embodiment of the present invention comprises a first step of grinding, a second step of purification, a third step of spraying and drying particles, a fourth step of adding organic bonding agent, a fifth step of press molding, and a sixth step of crystal growth.

The first step of grinding includes crushing and grinding the powder of an aluminum oxide ($Al_2O_3$) into micro powder particles.

In the first step of grinding, the powder of the aluminum oxide is ground by a chemical assistant, and the micro powder particles of the aluminum oxide have a size of at least ten nanometers. The crushing work is a coarse grinding work, and the grinding work is used to obtain particles whose diameter is smaller than a micrometer. The crushing work is performed by a crushing machine, and the grinding work is performed by a ball mill method. The crushing and grinding works can achieve the following purposes, including: breaking the condensation, reducing the condensation, forming the powder particles into ultimate particles, reducing the diameter of the powder particles, eliminating the coarse particles, and distributing the powder particles in a determined field to satisfy the specification requirement of the proper particle distribution. The large number of micro powder particles has a larger surface area and a larger reaction activity, so that the powder particles are mixed with each other evenly, and the powder particles and the solvent are mixed evenly. The powder particles are crushed, broken or flattened by collision, milling and rubbing between the powder particles, to increase the surface area of the powder particles, so that the surface free energy of the powder particles is increased. Thus, the crush action is an energy transfer process that transfers a mechanical energy or work into a surface energy. Therefore, in the physical aspect, the crush action is an energy transfer process. In addition, when the powder particles are finer and the structure of the aluminum oxide is more incomplete, the activity of the aluminum oxide is greater, thereby facilitating the sintering process of the aluminum oxide. Thus, the particles and the structure determine the density of the blank. In addition, the contact points of the powder particles in the unit volume are inverse proportion to the square of the diameter of the powder particles, so that when the diameter of the powder particles is decreased, the expand passing speed of the powder particles is increased apparently. On the other hand, when the powder particles are finer, the surface area of the powder particles is larger, so that the surface expanding effect is greater. In addition, the surface expanding effect of the powder particles is greater than that of the volume expanding effect of the powder particles. In addition, the sintering speed is determined by the drive force, the expand passing speed and the contact area of the powder particles. Thus, the sintering speed is determined by the diameter of the powder particles to save the crystal growth time at a high temperature and the quality of the crystal.

The second step of purification includes purifying the powder particles of the aluminum oxide to reach a purity more than 99.999%.

In general, the ceramic material has a smaller purity so that the uniformity, stability and reliability of the quality of the ceramic material are worse than that of the metallic and high molecular material. Thus, the purification step of the present invention can purify the powder particles of the aluminum oxide to reach a purity more than 99.999% to enhance the uniformity, stability and reliability of the quality of the aluminum oxide ceramic.

The third step of spraying and drying particles includes stirring the purified powder particles of the aluminum oxide to form a glue-shaped aluminum oxide, pressurizing the glue-shaped aluminum oxide, spraying the glue-shaped aluminum oxide, and drying the glue-shaped aluminum oxide to form aluminum oxide particles having uniform sizes.

In the third step of spraying and drying particles, a determined amount of solvent is added into the purified powder particles of the aluminum oxide to form a mixture which is stirred strongly by a strongly stirred pump to form the glue-shaped aluminum oxide. Then, the glue-shaped aluminum oxide is pressurized by a high pressure pump. Then, the glue-shaped aluminum oxide is conveyed into a nozzle. Then, the glue-shaped aluminum oxide is sprayed from the nozzle into a drying tower at a high temperature. Then, the glue-shaped aluminum oxide is dried instantaneously by a hot air flow in the drying tower to form the aluminum oxide particles having uniform sizes. Then, the aluminum oxide particles having uniform sizes are collected. In application of the nanometer powder particles, collection of the nanometer powder particles is the minor technology because the nanometer powder particles will float in the air and sucked into the human body, thereby causing danger to the human body. In the conventional high temperature method, the combination collect method will make the nanometer powder particles gather and become larger to lose the nanometer size. In the present invention, the growth method uses the low temperature procedure to collect the nanometer powder particles, so that the nanometer powder particles are gathered secondarily under the low temperature procedure and maintain the original nanometer size. In addition, the growth method can filter and eliminate the impurities to purify the aluminum oxide powder particles. Thus, the aluminum oxide powder particles made by the growth method of the present invention contain very few impurities and have smaller diameter.

The fourth step of adding organic bonding agent includes adding an organic bonding agent into the aluminum oxide particles having uniform sizes.

The fifth step of press molding includes press molding the aluminum oxide particles having uniform sizes to form an aluminum oxide blank having a predetermined shape.

In the fifth step of press molding, the aluminum oxide particles having uniform sizes are placed into a die, and are then press molded by a press to form the aluminum oxide blank having a predetermined shape. In the fifth step of press molding, the aluminum oxide blank contains little organic bonding agent, so that the aluminum oxide blank can be pre-burned directly, has smaller shrink, and can be produced automatically. In the fifth step of press molding, the aluminum oxide particles are closer to each other in the die, and are connected together solidly by the inner bonding force, so that the aluminum oxide blank has a predetermined shape. The press molding process is operated easily and has a shorter cycle and higher efficiency, so that the press molding process is available for automatic production. In addition, the aluminum oxide blank has a greater density, an exact size, a smaller shrink, a higher mechanic strength and a higher electric capacity.

The sixth step of crystal growth includes pre-burning the aluminum oxide blank having a predetermined shape into an aluminum oxide cake disposed at a half-baked state, heating the aluminum oxide cake into a melted state until aluminum oxide crystals are grown, and solidifying, cooling and shrinking the aluminum oxide crystals into a single-crystal sapphire.

In the sixth step of crystal growth, the aluminum oxide blank having a predetermined shape is pre-burned in a vacuum furnace at a high temperature (more than 1600° C.) to eliminate tiny organic substances, impurities (the organic substances and impurities are floated easily and have a lighter weight so that they can be eliminated at a high temperature) and air bubbles contained in the aluminum oxide blank to form the aluminum oxide cake having a compact specific density. The vacuum furnace has an air drain conduit to drain air containing impurities. Then, the vacuum furnace is evacuated to introduce an inert gas into the vacuum furnace. Then, the temperature in the vacuum furnace is increased to heat the aluminum oxide cake into a melted state.

In the present invention, the vacuum furnace contains a crucible made of metallic material, such as molybdenum (Mo), zirconium (Zr), Platinum (Pt) and the like, a thermal body, a shielding device and a cooling device. In addition, the temperature of the present invention is set at about 2040° C. to 2100° C. In addition, the sapphire crystal growth method of the present invention saves a growing time of one time, saves an energy lost of one time, has a lower price, has crystals whose mass and size are unlimited, and has a higher quality.

Accordingly, by use of the sapphire crystal growth method of the present invention, the temperature gradient is directed toward a direction opposite to that of the gravity during the crystal growth, while the crucible, the crystal and the thermal body are stationary so as to prevent from incurring a melt flow due to the heat convection and mechanical movement. In addition, by use of the sapphire crystal growth method of the present invention, the crystal is encompassed by the melt and disposed in the thermal zone after the crystal growth, so that the cooling speed of the crystal can be controlled to reduce the thermal stress, thereby preventing the crystal from being broken and dislocated. Further, by use of the sapphire crystal growth method of the present invention, the solid-liquid interface is encompassed by the melt during the crystal growth, so that the temperature and mechanical perturbations on the surface of the crystal are reduced or eliminated by the melt, thereby enhancing the quality of the crystal. Further, the sapphire crystal growth method of the present invention has a shorter crystal growth time than that of the conventional crystal growth method. Further, the sapphire crystal growth method of the present invention has a lower price. Further, the sapphire crystal growth method of the present invention has crystals whose mass and size are unlimited, and has a higher quality.

Although the invention has been explained in relation to its preferred embodiment(s) as mentioned above, it is to be understood that many other possible modifications and variations can be made without departing from the scope of the present invention. It is, therefore, contemplated that the appended claim or claims will cover such modifications and variations that fall within the true scope of the invention.

The invention claimed is:

1. A sapphire crystal growth method, comprising:
   a first step of grinding including crushing and grinding a powder of an aluminum oxide into micro powder particles;
   a second step of purification including purifying the powder particles of the aluminum oxide to reach a purity more than 99.999%;
   a third step of spraying and drying particles including stirring the purified powder particles of the aluminum oxide to form a glue-shaped aluminum oxide, pressurizing the glue-shaped aluminum oxide, spraying the glue-shaped aluminum oxide, and drying the glue-shaped aluminum oxide to form aluminum oxide particles having uniform sizes;
   a fourth step of adding organic bonding agent including adding an organic bonding agent into the aluminum oxide particles having uniform sizes;
   a fifth step of press molding including press molding the aluminum oxide particles having uniform sizes to form an aluminum oxide blank;
   a sixth step of crystal growth including pre-burning the aluminum oxide blank into an aluminum oxide cake disposed at a half-baked state, heating the aluminum oxide cake into a melted state until aluminum oxide crystals are grown, and solidifying, cooling and shrinking the aluminum oxide crystals into a single-crystal sapphire.

2. The sapphire crystal growth method in accordance with claim 1, wherein in the first step of grinding, the micro powder particles of the aluminum oxide have a size of at least ten nanometers.

3. The sapphire crystal growth method in accordance with claim 1, wherein in the third step of spraying and drying particles, the growth method uses a low temperature procedure to collect the nanometer powder particles, so that the nanometer powder particles are gathered secondarily under the low temperature procedure and maintain the original nanometer size.

4. The sapphire crystal growth method in accordance with claim 3, wherein the growth method can filter and eliminate impurities to purify the aluminum oxide powder particles.

5. The sapphire crystal growth method in accordance with claim 1, wherein in the first step of grinding, the powder of the aluminum oxide is ground by a chemical assistant.

6. The sapphire crystal growth method in accordance with claim 1, wherein in the third step of spraying and drying particles, a determined amount of solvent is added into the purified powder particles of the aluminum oxide to form a mixture which is stirred strongly by a strongly stirred pump to form the glue-shaped aluminum oxide.

7. The sapphire crystal growth method in accordance with claim 6, wherein in the third step of spraying and drying particles, the glue-shaped aluminum oxide is pressurized by a high pressure pump.

8. The sapphire crystal growth method in accordance with claim 7, wherein in the third step of spraying and drying particles, the glue-shaped aluminum oxide is conveyed into a nozzle, then sprayed from the nozzle into a drying tower at a high temperature and is then dried instantaneously by a hot air flow in the drying tower to form the aluminum oxide particles having uniform sizes.

9. The sapphire crystal growth method in accordance with claim 1, wherein in the fifth step of press molding, the aluminum oxide particles having uniform sizes are placed into a die, and are then press molded by a press to form the aluminum oxide blank.

10. The sapphire crystal growth method in accordance with claim 1, wherein in the fifth step of press molding, the aluminum oxide blank contains the organic bonding agent, so that the aluminum oxide blank can be pre-burned directly.

11. The sapphire crystal growth method in accordance with claim 1, wherein in the sixth step of crystal growth, the aluminum oxide blank is pre-burned in a vacuum furnace at a higher temperature to eliminate tiny organic substances, impurities and air bubbles contained in the aluminum oxide blank to form the aluminum oxide cake having a compact specific density.

12. The sapphire crystal growth method in accordance with claim 11, wherein the vacuum furnace has an air drain conduit to drain air containing impurities.

13. The sapphire crystal growth method in accordance with claim 12, wherein the vacuum furnace is evacuated to introduce an inert gas into the vacuum furnace, and a temperature in the vacuum furnace is increased to heat the aluminum oxide cake into the melted state.

14. The sapphire crystal growth method in accordance with claim 1, wherein in the first step of grinding, the crushing work is performed by a crushing machine, and the grinding work is performed by a ball mill method.

* * * * *